United States Patent [19]

Chan et al.

[11] Patent Number: 5,329,143
[45] Date of Patent: Jul. 12, 1994

[54] ESD PROTECTION CIRCUIT

[75] Inventors: Tsiu C. Chan, Carrollton; David S. Culver, The Colony, both of Tex.

[73] Assignee: SGS Thomson Microelectronics, Inc., Carrollton, Tex.

[21] Appl. No.: 991,702

[22] Filed: Dec. 17, 1992

Related U.S. Application Data

[63] Continuation of Ser. No. 711,549, Jun. 5, 1991, abandoned.

[51] Int. Cl.[5] .................... H01L 29/78; H01L 27/02
[52] U.S. Cl. ................................. 257/173; 257/357; 257/362
[58] Field of Search .............. 357/23.13, 42, 52, 40, 357/41, 23.8, 52 D; 361/56, 91; 257/173, 174, 355–357, 362, 363, 557, 584, 589

[56] References Cited

U.S. PATENT DOCUMENTS

| | | | |
|---|---|---|---|
| 4,131,908 | 12/1978 | Davis et al. | 257/357 |
| 4,720,737 | 1/1988 | Shirato | 357/23.13 |
| 4,733,285 | 3/1988 | Ishioka et al. | 357/23.13 |
| 4,760,433 | 7/1988 | Young et al. | 257/357 |
| 4,924,339 | 5/1990 | Atsumi et al. | 357/23.13 |
| 5,014,105 | 5/1991 | Hata et al. | 357/42 |
| 5,017,985 | 5/1991 | Lin | 357/23.13 |
| 5,072,271 | 12/1991 | Shimizu et al. | 357/23.13 |

FOREIGN PATENT DOCUMENTS

| | | |
|---|---|---|
| 0260125 | 3/1988 | European Pat. Off. |
| 0291242 | 11/1988 | European Pat. Off. |
| 0326777 | 8/1989 | European Pat. Off. |
| 0371663 | 6/1990 | European Pat. Off. |
| 0408457 | 1/1991 | European Pat. Off. |
| 0115764 | 5/1987 | Japan ............................. 357/23.13 |
| 8702511 | 4/1987 | World Int. Prop. O. |

OTHER PUBLICATIONS

RCA Technical Notes, Jul. 25, 1979, Princeton, N.J. Improved COS/MOS Inverter Circuit for Reducing Burn-Out and Latch-up, A. G. F. Dingwall.

*Primary Examiner*—Rolf Hille
*Assistant Examiner*—Peter Toby Brown
*Attorney, Agent, or Firm*—Kenneth C. Hill; Lisa K. Jorgenson; Richard K. Robinson

[57] ABSTRACT

An ESD protection circuit and structure for integrated circuit devices uses a lateral NPN transistor to provide a low resistance discharge path for ESD transient voltages. A preferred structure also includes a modification to an N-channel output drive transistor to eliminate the parasitic bipolar transistor that induces snapback.

17 Claims, 2 Drawing Sheets

ESD PROTECTION CIRCUIT

This application is a continuation of Ser. No. 711,549, filed Jun. 5, 1991, now abandoned.

BACKGROUND OF THE INVENTION

1. Field of the Invention

The present invention relates generally to integrated circuit structures, and more specifically to an electrostatic discharge protection circuit and layout structure suitable for use with CMOS devices.

2. Description of the Prior Art

Integrated circuit devices, especially CMOS devices, are susceptible to electrostatic discharge (ESD) induced failure. ESD is typically a high voltage, short duration spike such as caused by discharge of a built up static charge. ESD can damage or completely destroy integrated circuit devices if provisions are not made to minimize its effects.

ESD protection circuits are employed on all input and output pins of most integrated circuit devices. ESD protection circuits currently in wide use typically employ diode clamps, lateral punch-through devices, and guard ring collectors around an input/output bonding pad. These circuits are reasonably effective at protecting input circuits, but are less effective at protecting output circuits from very high voltage transients over approximately 3,000 volts.

The output circuitry of CMOS devices is especially vulnerable to ESD induced failure because the drain of an N-channel drive transistor is tied directly to the output bonding pad of the device. For high ESD voltages, the N-channel output device will be driven into snapback breakdown, which either permanently destroys the drain junction or ruptures the gate oxide of the transistor. In either case, the integrated circuit is rendered wholly or partially non-functional.

As the packing density for CMOS devices continues to increase, they will only become more susceptible to ESD induced failures. The use of thinner gate oxides, shallower source/drain junctions, and more closely spaced components simply exacerbates the problems which have been experienced in the past.

It would be desirable to provide an ESD protection circuit and structure which is suitable for use with CMOS devices, and which provides improved ESD protection. It would be further desirable for such a circuit and structure to be compatible with standard CMOS processing, and provide enhanced protection with little or no additional process flow complexity.

SUMMARY OF THE INVENTION

Therefore, according to the present invention, an ESD protection circuit and structure for integrated circuit devices uses a lateral NPN transistor to provide a low resistance discharge path for ESD transient voltages. A preferred structure also includes a modification to an N-channel output drive transistor to eliminate the parasitic bipolar transistor that induces snapback.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
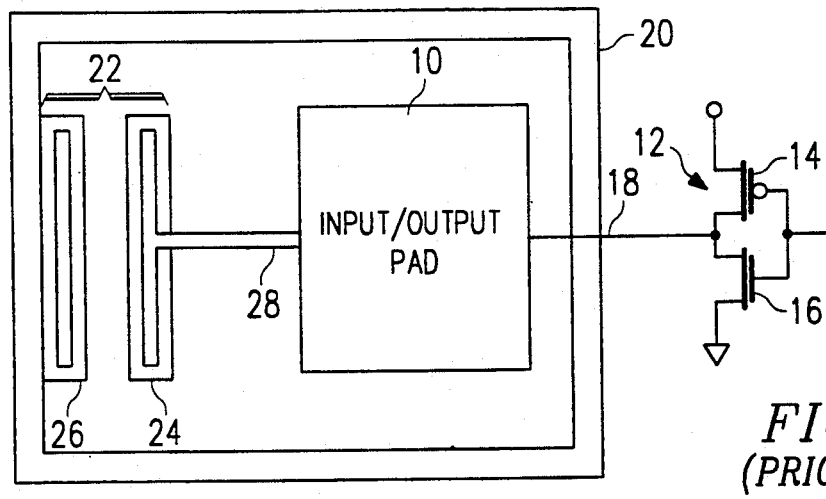
FIG. 1 is a plan view of a prior art input/output ESD protective structure.

FIG. 1 illustrates a typical ESD protection structure according to the prior art. An input/output pad 10 is used to bond to a lead frame lead (not shown) in order to make connection off of the device. The circuit shown is for an output pin from the device, and utilizes CMOS technology.

The CMOS output driver 12 consists of a P-channel transistor 14 and an N-channel transistor 16 connected to form an inverter as known in the art. The output from the inverter 12 is connected directly to the input/output pad 10 by a metal signal line 18. Signal line 18 and buffer 12 are only shown schematically in FIG. 1.

Within the substrate of the device, within a p-well, a heavily doped P-type collector guard ring 20 surrounds the region in which the bond pad 10 is formed. Also contained within the guard ring 20 is a punch through device 22 consisting of N+ regions 24 and 26, and the surrounding portion of the p-well in which they are formed. N+ region 24 is connected to the bond pad 10 by a metal signal line 28. N+ region 26 lies adjacent to a portion of the guard ring 20 and is connected to it by a metal strap 30 in FIG. 2. Both the N+ region 26 and the guard ring 20 are connected to a source voltage $V_{ss}$, which is ground in the preferred embodiment. The p-well in which the guard ring 20 and other structures are formed is also connected to ground potential.

Figure 2:
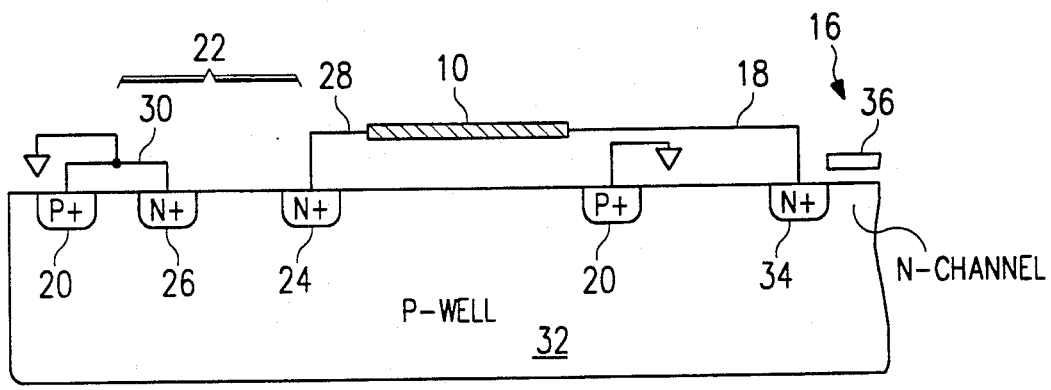
FIG. 2 is a cross sectional view of a portion of the structure of FIG. 1.

FIG. 2 is a cross sectional view of the structure of FIG. 1 and illustrates the construction of the devices shown therein. As just described, the guard ring 20 is connected to ground. The N+ region 26 is connected to ground and the guard ring 20 by a metal strap 30. All of the structures, including the output N-channel transistor 16, are formed in a p-well 32. Only the drain 34 and a portion of the gate 36 of the N-channel device are depicted in FIG. 2.

When a positive voltage spike occurs, punch through occurs in the device 22. The PN junction between the N+ region 24 and the p-well 32 breaks down, and current flows from the bond pad 10 to ground through the N+ devices 24 and 26. When very high voltages are encountered, the relatively high resistance of the p-well 32 prevents a fast enough discharge to ground. The voltage on the bond pad 10 rises high enough to raise the voltage on the drain 34, causing snapback breakdown to occur. This results directly from the fact that the discharge path to ground has a relatively high resistance, and the parasitic bipolar transistor on the N-channel output driver 16 reaches a high enough voltage to turn on.

Figure 3:
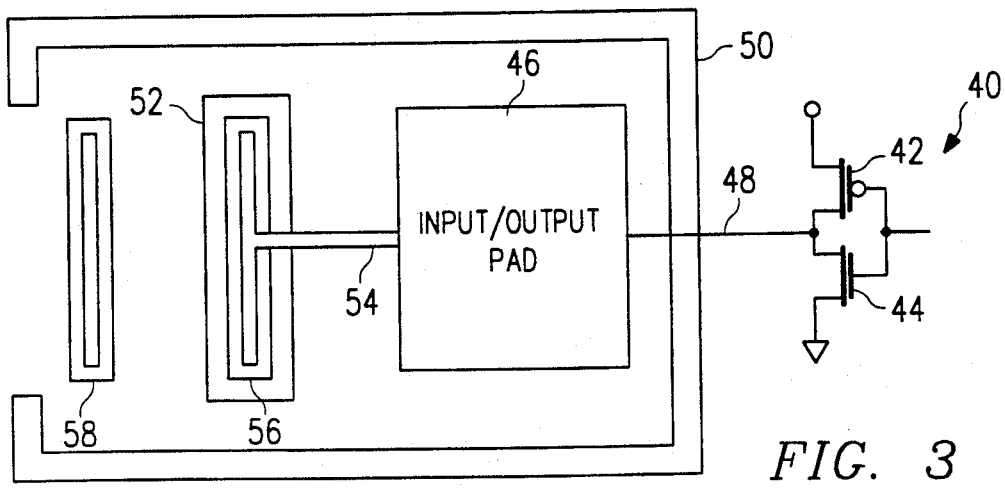
FIG. 3 is a layout of a preferred structure for an ESD protection circuit according to the present invention.
Figure 4:
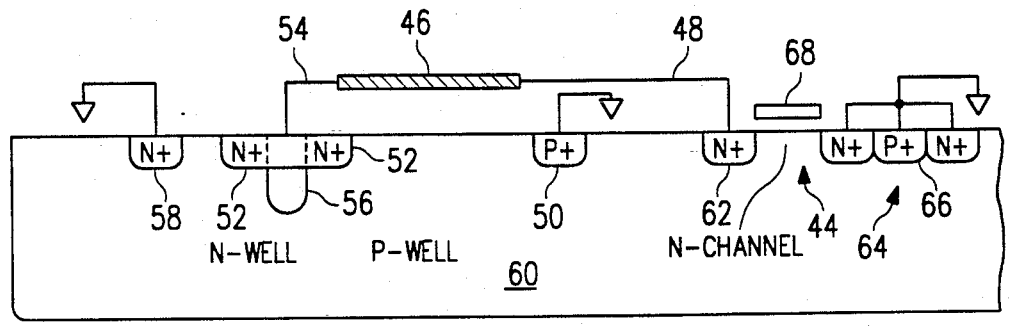
FIG. 4 is a cross-sectional view of a portion of the structure of FIG. 3.
Figure 5:
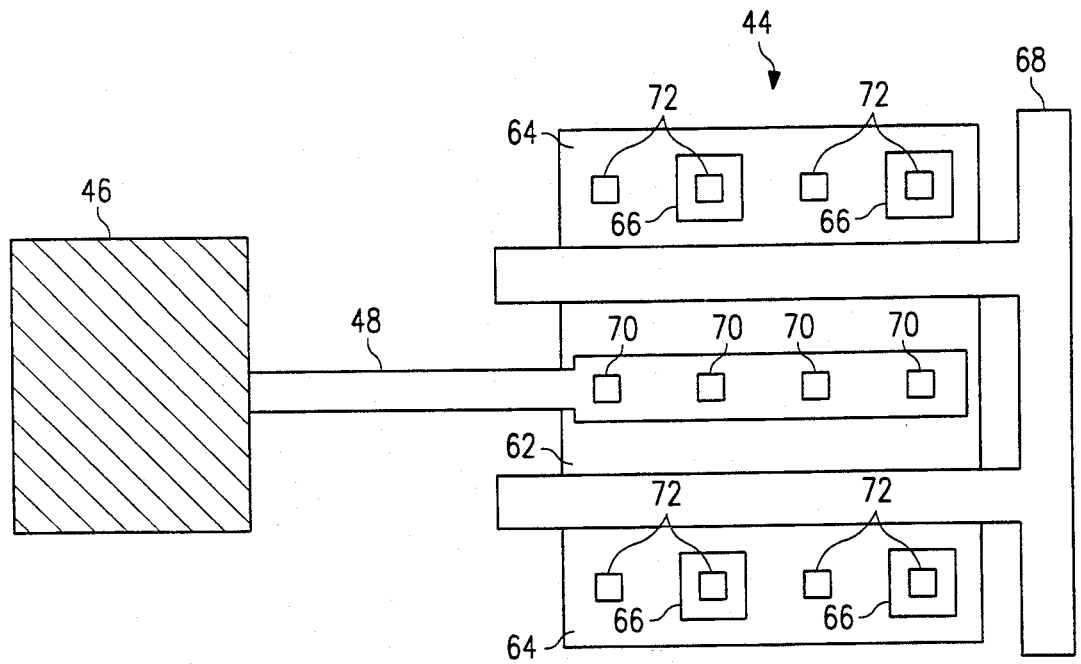
FIG. 5 is a layout for a preferred transistor design according to the present invention.

FIGS. 3 through 5 illustrate a preferred ESD protection circuit and layout which provide improved protection over prior art devices. Output driver 40 has a P-channel transistor 42 and an N-channel transistor 44. The output of the output driver 40 is connected to an input/output bond pad 46 by a metal signal line 48. A P+ guard ring 50 surrounds the bond pad 46 and is connected to ground potential.

N+ region 52 defines the collector of a lateral NPN bipolar transistor, and is connected to the bond pad 46 by a metal signal line 54. N+ region 52 has an n-well region 56 which will be described in more detail in connection with FIG. 4. N+ region 58 acts as the emitter of the lateral bipolar transistor. Guard ring 50 and the p-well in which the devices are formed act as the base for the transistor. There is a gap in the guard ring 50 adjacent the emitter region 58, and the emitter 58 is spaced in from the guard ring base 50 so that they are not in contact. This extra spacing compared to prior art devices allows the NPN lateral transistor to function, and increases its base resistance. The emitter 58 is strapped to ground with a metal line (not shown in FIG. 3).

As shown in FIG. 4, the n-well region 56 extends below the N+ emitter region 52 into the p-well region 60. The N-channel transistor 44 is formed in the same p-well 60 as the remaining elements as shown in FIG. 4. Drain 62 of the N-channel transistor is connected to metal line 48 as described previously. A source region 64 has localized P+ regions 66 which extend into the p-well 60. These regions 66 are described in greater detail in connection with FIG. 5.

When the voltage on the bond pad 46 goes high enough, the junction between the N+ collector region 52 and the p-well 60 breaks down. This causes current to flow into the base/guard ring contact 50. The p-well 60 has a relatively high resistance, so that a voltage drop occurs in the p-well 60. When the current flow becomes great enough, the voltage difference between the base 50 and the emitter 58, in the substrate, becomes large enough to turn on the lateral bipolar transistor. This voltage is typically about 0.6 volts. When the lateral bipolar turns on, a low resistance current path is formed to ground through the emitter 58, and the voltage on the pad 46 is discharged. When the current from the pad 46 drops low enough, the 0.6 volts turn-on voltage is no longer generated, and the lateral NPN transistor turns off.

When the relatively high ESD currents are flowing through the lateral NPN transistor, the metal line 54 becomes hot. This line is preferably formed from aluminum, which will tend to alloy with the underlying silicon as it heats up. This in turn causes the formation of aluminum spikes into the substrate. The deep n-well region 56 is included to prevent this from becoming a serious problem. The n-well 56 is deep enough that the aluminum spikes do not make contact with the p-well 60 and short out the junction between regions 52 and 60. Thus, several ESD events can occur, each generating aluminum spikes, or enlarging and deepening those already there, without damaging the underlying junction.

When a negative spike occurs on the pad 46, the p-well 60 to collector 52 junction is forward biased, since the p-well 60 is at ground potential. Current simply flows onto the pad and no circuit elements are unduly stressed.

FIG. 5 is a layout view of the N-channel transistor 44. A gate 68 overlies a channel region between the source regions 64 and the drain region 62. Multiple contacts 70 are made between the metal line 48 and the drain 62. Multiple contacts 72 are also made to the source regions 64 by ground lines (not shown). Some of the contacts 72 are made through P+ regions 66. This ties the N-channel source to the p-well potential, minimizing any voltage drop which will tend to occur between them. This prevents the parasitic bipolar transistor from turning on, since a, typical, 0.6 volts drop is required between the base and emitter of the parasitic for turn on. This prevents damage to the N-channel transistor 44 which is caused by snapback. Combined with the improved low resistance current path provided by the lateral NPN transistor connected to the pad 46, the likelihood of catastrophic damage occurring to the N-channel transistor 44 is greatly diminished.

Only a few of the contacts 72 have associated P+ regions 66. This keeps the series resistance of the N-channel transistor 44 from becoming too high, and prevents a degradation in the N-channel gain. Using too many P+ regions 66 would decrease gain and increase series resistance. Using too few may not prevent the parasitic bipolar transistor from turning on.

Variations in the layout can be made to suit the particular process parameters used to fabricate the device. For example, the distance between the base region 50 and the emitter 58 can be increased to increase the base resistance. Increasing the base resistance lowers the turn-on current which is necessary to generate the 0.6 volts turn-on voltage. If the resistance increases too much, this current becomes very low and an SCR is formed. This can cause undesired device operation if the lateral NPN transistor turns on and remains on even after the ESD event is completed. Moving the emitter too close to the base decreases the base resistance, which increases the current required to turn on the lateral bipolar transistor. A value for base resistance is easily calculated from the resistivity of the p-well 60, and a turn on current can be selected which is desired for the device.

It will be apparent to those skilled in the art that the described structure can be easily fabricated using process steps already utilized in the fabrication of CMOS devices elsewhere on the device. For example, the n-well 56 is masked and formed at the same time as the n-wells used to form the P-channel transistors. The various P+ and N+ regions are formed simultaneously with the appropriate source/drain regions being formed elsewhere. Thus, the described structure adds no complexity to standard CMOS process flows, allowing it to be easily incorporated into already designed CMOS devices.

While the invention has been particularly shown and described with reference to a preferred embodiment, it will be understood by those skilled in the art that various changes in form and detail may be made therein without departing from the spirit and scope of the invention.

What is claimed is:

1. An electrostatic discharge protection circuit for a semiconductor integrated circuit, comprising:
   an input/output bonding pad;
   an output driver connected to said bonding pad;
   a bipolar transistor connected to said bonding pad, wherein a high voltage on said bonding pad causes said bipolar transistor to turn on and shunt current from said bonding pad to ground; and
   a heavily doped guard ring partially surrounding said bipolar transistor, wherein said guard ring has a gap located adjacent an emitter of said bipolar transistor, and wherein the gap is positioned to control a voltage at which said bipolar transistor turns on.

2. The circuit of claim 1, wherein said bipolar transistor comprises a lateral npn transistor.

3. The circuit of claim 1, wherein said guard ring functions as a base for said bipolar transistor.

4. The circuit of claim 3, wherein said guard ring is doped p-type, and said bipolar transistor comprises an npn transistor.

5. The circuit of claim 1, wherein a collector of said bipolar transistor is connected to said bonding pad.

6. The circuit of claim 5, wherein the collector is connected to said bonding pad by a metal signal line.

7. The circuit of claim 6, wherein the metal signal line comprises an aluminum signal line.

8. The circuit of claim 7, wherein said bipolar transistor has a relatively deep collector region beneath a contact region to the aluminum signal line.

9. The circuit of claim 1, wherein said output driver comprises a CMOS buffer.

10. The circuit of claim 9, wherein said CMOS buffer comprises an inverter.

11. The circuit of claim 10, wherein an N-channel transistor of the inverter is formed in a p-type well in common with said bipolar transistor.

12. The circuit of claim 11, wherein the N-channel transistor has a drain region connected to said bonding pad and a source region connected to a device ground, and wherein the source region includes at least one heavily doped p-type region connected to the device ground.

13. An output protection circuit for a CMOS device, comprising:
   a p-type well region in a semiconductor substrate;
   a heavily doped guard ring in said well, said heavily doped guard ring connected to a device ground;
   a first n-type region in said well near said guard ring, said first n-type region also connected to the device ground;
   a second n-type region in said well near said first n-type region;
   a bond pad connected to said second n-type region; and
   an N-channel transistor i said well, having a drain connected to said bond pad and a source, wherein the source has a plurality of heavily doped p-type regions within it contacting said well, wherein such p-type regions and the source are connected to the device ground;
   wherein said first n-type region and said guard ring are spaced apart a sufficient distance that ESD current flow within the well region generates a voltage differential between said first n-type region and said guard ring sufficient to turn on a lateral npn transistor, and wherein said first n-type region, said guard ring, and said second n-type region function respectively as an emitter, base, and collector of a lateral npn transistor which turns on and shunts current to device ground when a high voltage is present on said bond pad.

14. An output protection circuit for a CMOS device, comprising:
   a p-type well region in a semiconductor substrate;
   a heavily doped guard ring in said well, said heavily doped guard ring connected to a device ground;
   a first n-type region in said well near said guard ring, said first n-type region also connected to the device ground;
   a second n-type region in said well near said first n-type region;
   a bond pad connected to said second n-type region; and
   an N-channel transistor in said well, having a drain connected to said bond pad and a source connected to the device ground;
   wherein said first n-type region and said guard ring are spaced apart a sufficient distance that ESD current flow within the well region generates a voltage differential between said first n-type region and said guard ring sufficient to turn on a lateral npn transistor, wherein said first n-type region, said guard ring, and said second n-type region function respectively as an emitter, base, and collector of a lateral npn transistor which turns on and shunts current to device ground when a high voltage is present on said bond pad, and wherein said guard ring includes a gap therein in a portion nearest to said first n-type region.

15. The circuit of claim 14, wherein said collector n-type region is connected to said bond pad by an aluminum signal line, and a contact region wherein the aluminum signal line contacts said collector region has a relatively deep junction region.

16. The circuit of claim 15, wherein the relatively deep junction region is more lightly doped than the remaining portion of said collector region.

17. The circuit of claim 14, wherein the voltage differential generated by ESD current flow is approximately 0.6 volts.

* * * * *